(12) United States Patent
Meng

(10) Patent No.: US 8,926,153 B2
(45) Date of Patent: Jan. 6, 2015

(54) INTEGRATED LIGHT PIPE AND LED

(71) Applicant: International Business Machines Corporation, Armonk, NY (US)

(72) Inventor: Jian Meng, Kanata (CA)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/852,261

(22) Filed: Mar. 28, 2013

(65) Prior Publication Data

US 2014/0293642 A1   Oct. 2, 2014

(51) Int. Cl.
 *H05K 9/00* (2006.01)
 *F21V 8/00* (2006.01)
 *H01L 33/58* (2010.01)

(52) U.S. Cl.
 CPC .............. *G02B 6/0008* (2013.01); *H01L 33/58* (2013.01)
 USPC ............................ 362/555; 362/633; 362/632

(58) Field of Classification Search
 USPC .................. 362/632, 633, 612, 613, 629, 615
 See application file for complete search history.

(56) References Cited

U.S. PATENT DOCUMENTS

| | | | |
|---|---|---|---|
| 3,968,564 A | 7/1976 | Springthorpe | |
| 5,345,367 A | 9/1994 | Pierce et al. | |
| 5,938,324 A | 8/1999 | Salmon et al. | |
| 7,186,012 B2 | 3/2007 | Schevardo et al. | |
| 2003/0091820 A1* | 5/2003 | Robbins | 428/373 |
| 2008/0067534 A1* | 3/2008 | Hsieh et al. | 257/98 |
| 2009/0190371 A1 | 7/2009 | Root et al. | |
| 2010/0201649 A1* | 8/2010 | Kai et al. | 345/174 |
| 2010/0254149 A1 | 10/2010 | Gill | |
| 2010/0284179 A1* | 11/2010 | Striebel et al. | 362/217.1 |
| 2010/0291791 A1* | 11/2010 | Ko | 439/449 |

FOREIGN PATENT DOCUMENTS

JP   2003279805 A   10/2003

OTHER PUBLICATIONS

Bean, L, "Light Emitting Diode Embedded in Fiber Optics", Hub Pages, Last Updated Mar. 10, 2011. liambean.hubpages.com/hub/Light-Emitting-Diode-Embedded-in-Fiber-Optics.
Commissariat, T., "Optical fibres with integrated semiconductor junctions developed", Physicsworld.com, IOP a website from the Institute of Physics, Feb. 16, 2012. physicsworld.com/cws/article/news/2012/feb/16/optical-fibres-with-integrated-semiconductor-junctions-developed.

* cited by examiner

*Primary Examiner* — Tracie Y Green
(74) *Attorney, Agent, or Firm* — Zilka-Kotab, PC

(57) ABSTRACT

A method and apparatus is provided for an integrated light pipe. In one embodiment, the apparatus may include a light pipe with a cavity positioned at a first end of the light pipe. The apparatus may further include a light emitting diode (LED) coupled to the light pipe within the cavity. The apparatus may further include, the light emitted from the LED is directed through the light pipe. The apparatus may also include a first and second conductive mount coupled to the LED and extending out of the cavity.

17 Claims, 4 Drawing Sheets

INTEGRATED LIGHT PIPE AND LED

TECHNICAL FIELD

Embodiments described herein generally relate to light generating and directing devices, and more specifically to light pipes and LEDs.

BACKGROUND

Indicator lights are used for many types of devices. One type of device that indicator lights may be used on is electronic devices. Indicator lights on electronic devices may be used to communicate to users the status of aspects of the electronic equipment. The light for indicator lights for electronic equipment may be created by a light emitting diode (LED). The light from a LED may be transported by a light pipe to a location on the device that is visible to the user.

SUMMARY

A method of manufacture and apparatus for an integrated light pipe is provided. In one embodiment, a method of manufacturing may include a light pipe with first and second ends, and a cavity in the first end. The method may further include providing a light emitting diode (LED) within the cavity. The method may further include, providing a first and second conductive mounts. The method may further include, the coupling of the LED to the light pipe within the cavity such that light emitted from the LED is directed through the light pipe from the first end to the second end of the light pipe. The method may also include, positioning the first and second conductive mounts to couple with, and provide power to, the LED and to extend out of the cavity.

In one embodiment, the apparatus may include a light pipe with a cavity positioned at a first end of the light pipe. The apparatus may further include a light emitting diode (LED) coupled to the light pipe within the cavity. The apparatus may further include, the light emitted from the LED is directed through the light pipe. The apparatus may also include a first and second conductive mount coupled to the LED and extending out of the cavity

BRIEF DESCRIPTION OF THE DRAWINGS

In the Figures and the Detailed Description, like numbers refer to like elements.

DETAILED DESCRIPTION

Figure 1:
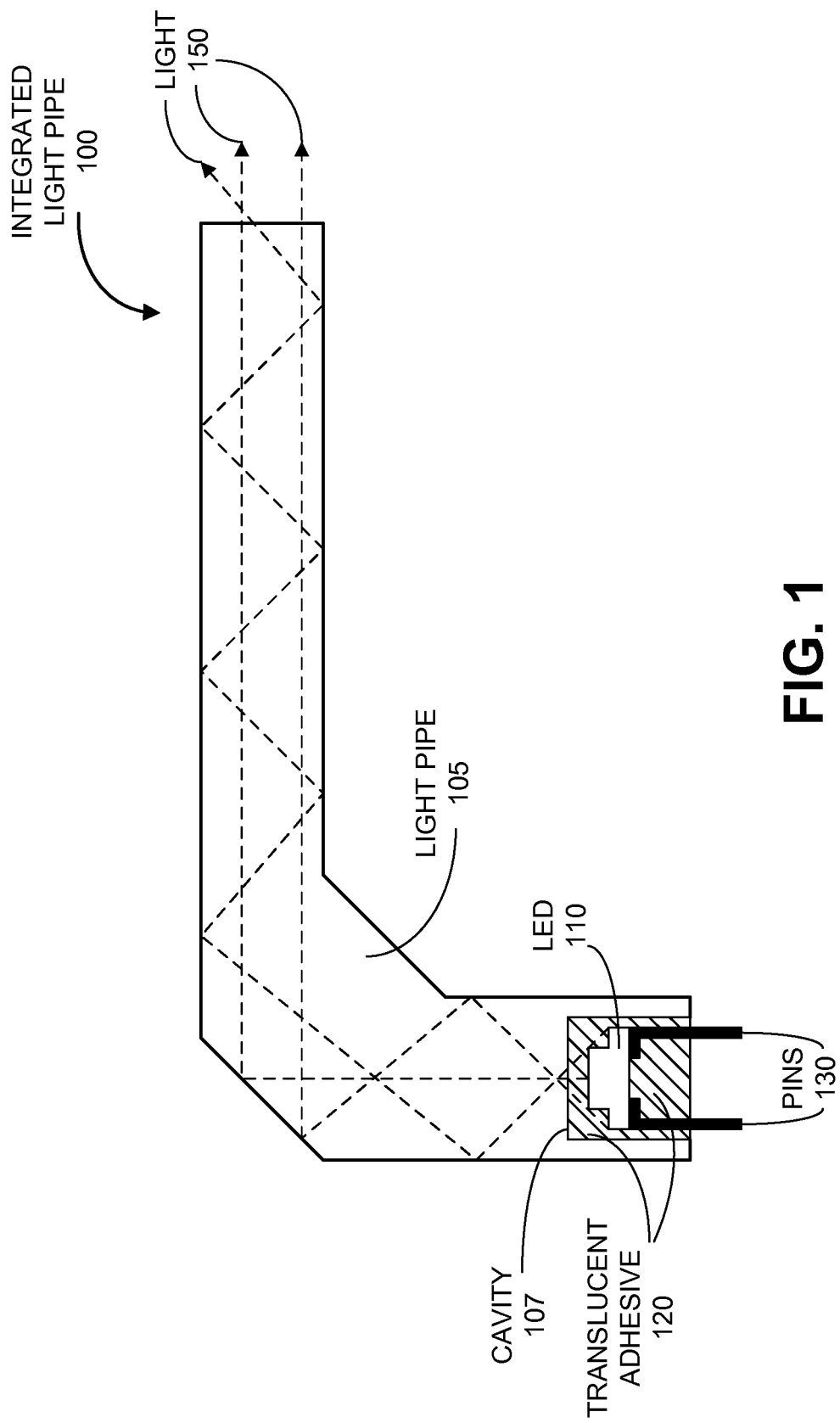
FIG. 1 is a cross-sectional side view of an integrated light pipe, according to an embodiment of the invention.

In electronic devices indicator lights are often used to communicate information to users. For example, indicator lights may be used to communicate power or readiness of a system. Often the indicator lights use a light emitting diode (LED) as a source of the light. LEDs are often used in conjunction with a light pipe to direct the light from the LEDs to specific locations for observation by users. The use of light pipes may allow for the LED, which may be delicate, to remain safely inside a housing or enclosure that may protect them from physical or elemental dangers. While commonly used in electronic devices, it is contemplated that a combination of LED and light tube may have uses elsewhere.

The type of light pipe most commonly used in the electronics industry may be molded plastic light pipes. Light pipes may also be known as light tubes. For example, it is common that light pipes may be used to direct illumination from LEDs on a circuit board to indicator symbols or buttons. These light pipes typically take on a highly complex shape that uses either gentle curving bends as in an optic fiber or have sharp prismatic folds, which reflect off the angled corners.

The use of light pipes for indicators may make electronics cheaper to manufacture since the alternate way would be to mount a tiny lamp into a small socket directly behind the spot to be illuminated. This may often requires extensive hand-labor for installation and wiring. Light pipes may permit all lights to be mounted on a single flat circuit board, but the illumination can be directed up and away from the board wherever it is required.

A LED is a semiconductor light source. LEDs are used as indicator lamps in many devices and are increasingly used for other lighting. Appearing as practical electronic components in 1962, early LEDs emitted low-intensity red light, but modern versions are available across the visible, ultraviolet, and infrared wavelengths, with very high brightness.

When a LED is forward-biased (switched on), electrons are able to recombine with electron holes within the device, releasing energy in the form of photons. This effect is called electroluminescence and the color of the light (corresponding to the energy of the photon) is determined by the energy gap of the semiconductor. An LED may often be small in area (less than 1 $mm^2$), and integrated optical components may be used to shape its radiation pattern. LEDs may present many advantages over incandescent light sources including lower energy consumption, longer lifetime, improved physical robustness, smaller size, and faster switching.

Currently, the combining of LEDs with light pipes may require the LED to be mounted, for example to a circuit board. The light tube may then be mounted over the LED. In doing it this way the LED and light tube use separate mounting hardware for the surface the LED is mounted on. Due to variance in manufacturing tolerances the alignment of the two may be difficult and require a much larger footprint on a mounting surface than mounting of the LED itself. This variance may also result in a large amount of space between mounted LEDs to prevent interference from each other. In various embodiments of the invention the footprint of the combined LED and light tube may be reduced saving space in size of mounting surface required. This may also improve install times and cost by improving ease of installation in reducing the mounting hardware required. It may also reduce bleed affects that may occur in standard LED and light pipe use. A bleed affect is the loss of light from an LED not entering the appropriate light pipe. The bleed affect may result in inefficiencies of the system and in some cases the lighting of an improper light pipe when multiple LEDs with multiple light pipes are mounted close to each other.

FIG. 1 is a cross sectional side view of an integrated light pipe 100, according to an embodiment of the invention. The integrated light pipe 100 combines a light pipe 105 and LED 110. The light pipe 105 may be positioned so that light 150 created by the LED 110 passes through the light pipe 105 to exit as shown. The light pipe 105 has a cavity 107 for installation of the LED 110. The cavity 107 may be large enough that the entire LED 110 body fits within the light pipe 105. The LED 110 may be coupled with the light pipe 105 and installed within the cavity 107 using a translucent adhesive 120. In the illustrated embodiment, the translucent adhesive 120 is used as a coupling agent between LED 110 and the light pipe 105. In various embodiments, the translucent adhesive may be epoxy, silicone, or glue. Other translucent adhesives 120 are also contemplated as possibly being used so long as they do not interfere with the operation of the LED 110.

In the illustrated embodiment, the translucent adhesive 120 is shown encompassing the LED 110. In other embodiments the an adhesive may only encompass part of the LED 110 so as to create coupling between the LED 110 and the light pipe 105. In various embodiments, the adhesive may pass light in varying degrees. For example, in an embodiment where the adhesive only couples the sides of LED 110 with the light pipe 105 the adhesive may be opaque. In other embodiments, the LED 110 may be coupled with the light pipe 105 using mechanical connectors. For examples, the LED 110 may be coupled to the light pipe 105 using pins or screws. It is contemplated that, a variety of coupling means may possibly be used and be within the scope of the invention. In various embodiments where adhesive is used, the adhesive may be nonconductive or an insulator.

The illustrated embodiment includes conductive mounts in the form of conductive mounting pins 130. The conductive mounting pins 130 are coupled with the LED 110 and extend from the LED 110 inside the light pipe 105 to outside the cavity 107. The conductive mounting pins 130 may allow for the integrated light pipe 100 to be mounted and electrically connected to a body. In various embodiments, the body the integrated light pipe 100 may be mounted and electrically connected to may be a circuit board. The conductive mounting pins 130 may provide electrical power to the LED 110. In various embodiments the conductive mounting pins 130 may be coupled to the LED 110 as part of the manufactured LED 110 or they may be added to the LED 110 during assembly of the integrated light pipe 100. In various embodiments, the conductive mounting pins may be coupled to the LED 110 by solder, press fit connections, clamp connections, or other connection types that may allow for the conductive mounting pins 130 and the LED 110 to have an electrical connection. The conductive mounts, shown here as conductive mounting pins 130, may provide part of the mounting hardware for mounting the integrated light pipe 100 to a surface. For example, the conductive mounting pins 130 may mount to a circuit board with receptors for the conductive mounting pins 130. For example, the receptors may be holes designed to receive the conductive mounting pins 130. In various embodiments, the conductive mounts may provide partial or complete support for the integrated light pipe 110 and power for the LED 110. The use of a nonconductive or insulating material for the translucent adhesive may prevent shorts as the conductive mounting pins 130 transfer power to the LED 110.

In various embodiments, the mounting pins 130 may be pins for mounting using through-hole technology (also spelled "thru-hole"). Through-hole mounting refers to a mounting scheme that may be used for electronic components that involves the use of leads on the components that are inserted into holes in printed circuit boards (PCB) and soldered to pads on the opposite side. In other embodiments, the conductive pins 130 may also be a press fit or snap fit type of mounting pin. These embodiments are examples of circuit boards having receptors for the mounting pins 130.

Figure 2:
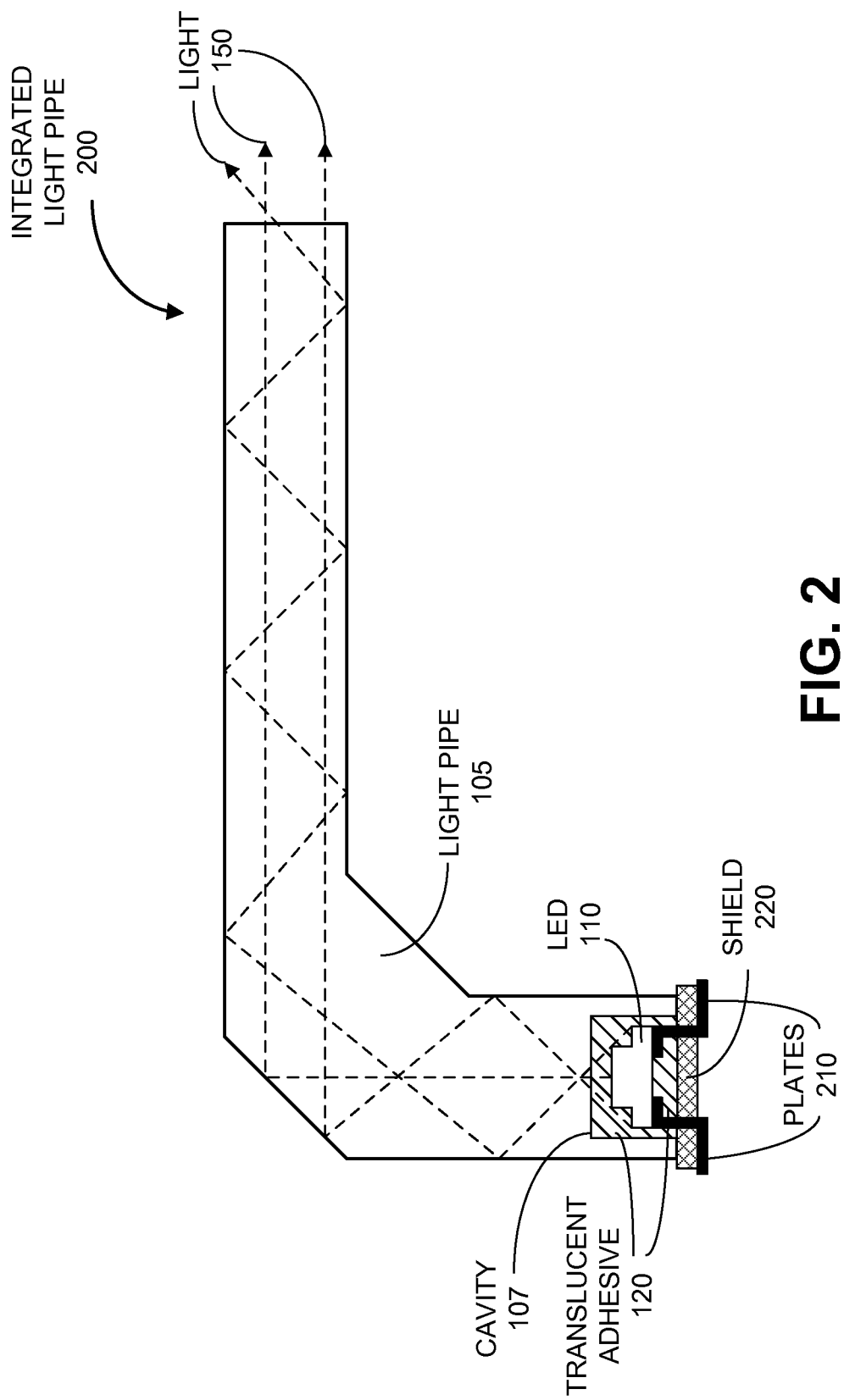
FIG. 2 is a cross-sectional side view of an integrated light pipe, according to an embodiment of the invention.

FIG. 2 is a cross sectional side view of an integrated light pipe 200, according to an embodiment of the invention. The integrated light pipe 200 combines a light pipe 105 and LED 110. The light pipe 105 may be positioned so that light 150 created by the LED 110 passes through the light pipe 105 to exit as shown. The light pipe 105 has a cavity 107 for installation of the LED 110. The cavity 107 is large enough that the entire LED 110 body fits within the light pipe 105. The LED 110 is coupled to the light pipe 105 within the cavity 107 using translucent adhesive 120. The translucent adhesive 120 is used as a coupling agent between LED 110 and the light pipe 105. Two conductive plates 210 may be coupled with and extend from the LED 110 inside the light pipe 105 to outside the cavity 107, and pass through shield 220. The conductive plates 210 may allow for the integrated light pipe 200 to be mounted and electrically connected to a body. In various embodiments, the body the integrated light pipe 200 may be mounted and electrically connected to may be a circuit board. The shield 220 may protect the integrated light pipe 200 during mounting that includes soldering.

The conductive plates 210 are an example of a surface-mount technology (SMT) mount type. SMT mounts may be used for mounting devices or components directly onto the surface of printed circuit boards (PCBs). A device or component using such mounts may also be called a surface-mount device (SMD). In various embodiments, SMT mounts may have short pins or leads of various styles, flat contacts, a matrix of solder balls (BGAs), or terminations on the body of the component.

In the illustrated embodiment, the conductive plates 210 are used as an example of the use of SMT mounts as conductive mounts. In various embodiments, the conductive plates 210 may act similar to the conductive mounting pins 130 in FIG. 1. They may be couple to the LED 110 by either being part of the LED 110 or connected to the LED 110 as described for the conductive mounting pins 130. In various embodiments, the conductive plates 210 may also be used to provide an electrical connection to the LED 110. While conductive plates 210 are illustrated it is contemplated that many other forms or shapes of SMT mounts may be used as a conductive mount used with a shield 220.

In various embodiments, the shield 220 may be used to protect the light pipe 105, translucent adhesive 120, or LED 110 from damage or harm caused by soldering the conductive plates 210 to a surface. For example, soldering the conductive plates to a circuit board as is common in SMT component mounting. In various embodiments, the shield 220 may be smaller and protect only a single element of the integrated light pipe 200 from harm during soldering. In other embodiments, the shield 220 may extend to protect several elements of the integrated light pipe 200. For example, in the illustrated embodiment the shield 220 may protect the light pipe 105 and translucent adhesive 120 during the soldering process. In other embodiments, the shield 220 may extend up and around part of the light pipe 105.

The shield 220 may be connected to using a variety of means including adhesive and mechanical. For example, in various embodiments the shield 220 may be attached with screws or pins. In other embodiments, the shield 220 may be press fit to either the conductive mounting pins 130 or the light pipe 105. In other embodiments, the shield 220 may be attached with adhesive. It is contemplated that, a variety of means for attaching the shield 220 may possibly be used and be within the scope of the invention.

Figure 3:
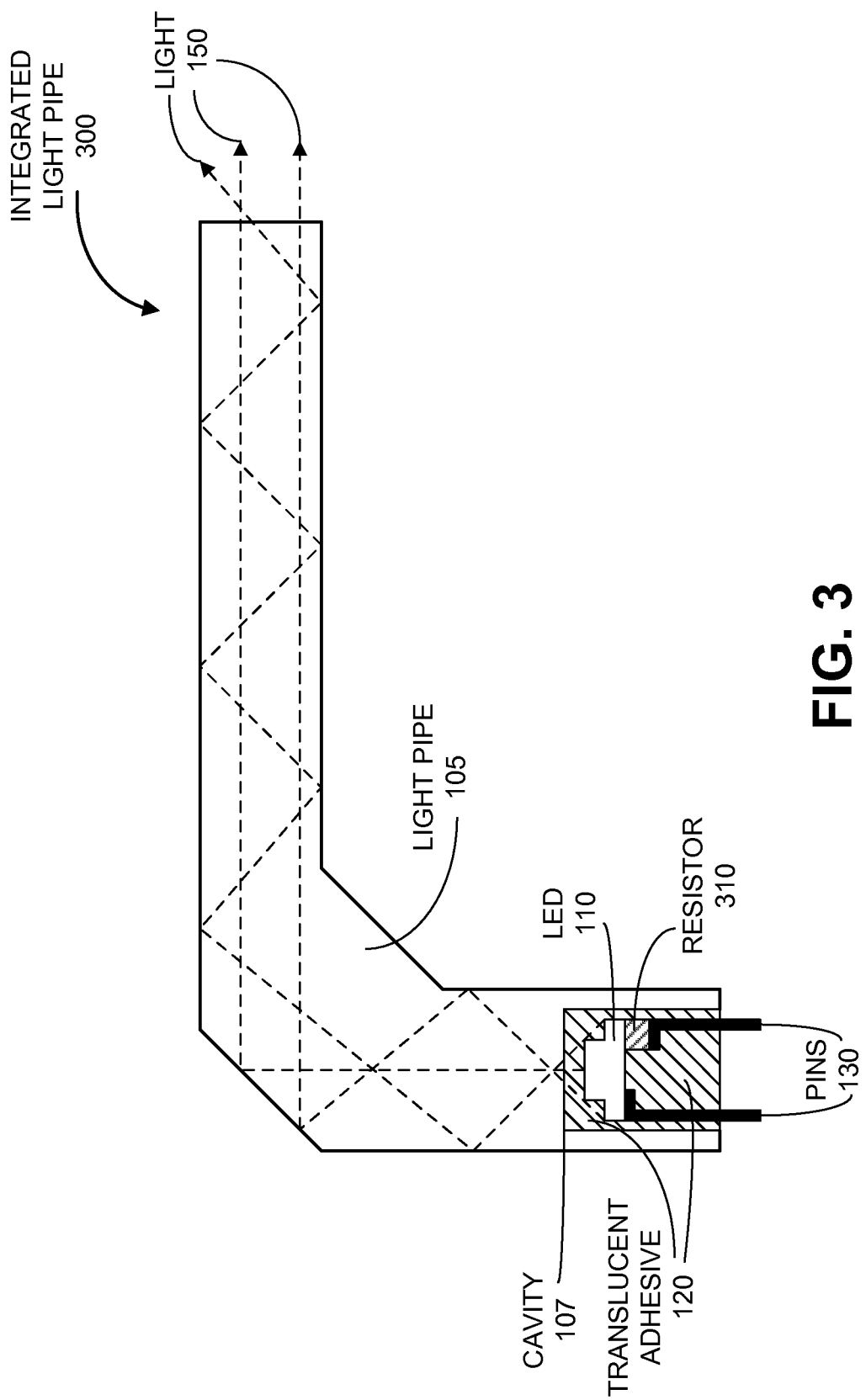
FIG. 3 is a cross-sectional side view of an integrated light pipe, according to an embodiment of the invention.

FIG. 3 is a cross sectional side view of an integrated light pipe 300, according to an embodiment of the invention. The integrated light pipe 300 combines a light pipe 105 and LED 110. The light pipe may be positioned so that light 150 created by the LED 110 passes through the light pipe 105 to exit as shown. The light pipe 105 has a cavity 107 for installation of the LED 110. The cavity 107 is large enough that the entire LED 110 body fits within the light pipe 105. The LED 110 may be coupled with the Led 110 within the cavity 107 using translucent adhesive 120. The translucent adhesive 120 is used as a coupling agent between LED 110 and the light pipe 105. A resistor 310 may be installed in electrical connection with the LED 110. The pins 130 extend from the LED 110 and the resistor 310 inside the light pipe 105 to outside the cavity 107. The pins 130 may allow for the integrated light pipe 100 to be mounted and electrically connected to a body. In various embodiments, the body the integrated light pipe 300 may be mounted and electrically connected to may be a circuit board.

In various embodiments, the resistor 310 may be used in series with the LED 110 may be a specification for the LED 110 called the characteristic forward voltage or recommended voltage. The characteristic forward voltage may have to be reached to turn 'on' the LED 110, but as the characteristic forward voltage is exceeded, the LED's 110 resistance may quickly drop off. Therefore, the LED 110 may begin to draw extra current and in some cases burn out. A resistor 310 may be used in series with the LED 110 to keep the current at a specific level called the characteristic forward current or recommended current.

Figure 4:
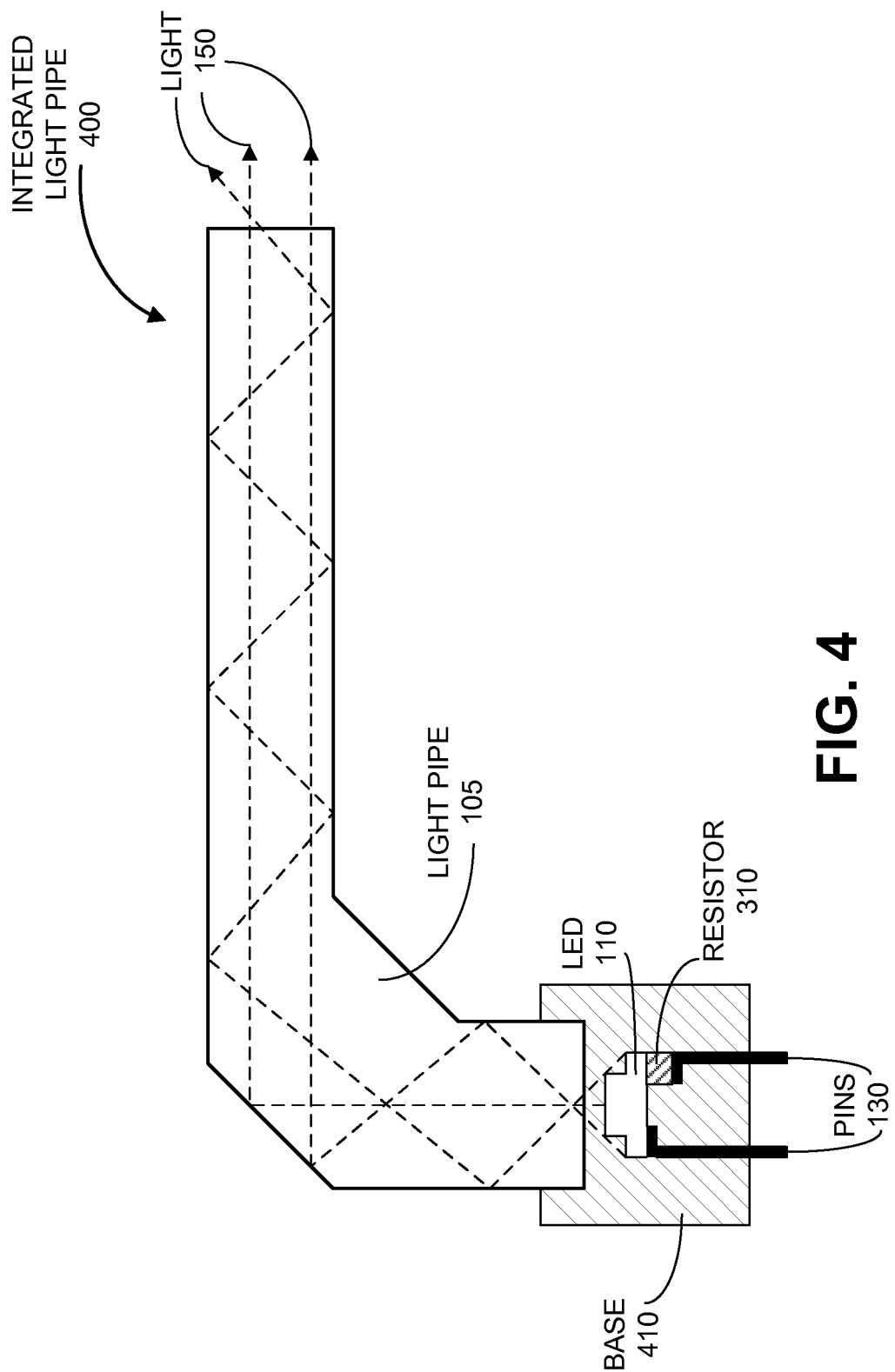
FIG. 4 is a cross-sectional side view of an integrated light pipe, according to an embodiment of the invention.

FIG. 4 is a cross sectional side view of an integrated light pipe 400, according to an embodiment of the invention. The integrated light pipe 400 combines a light pipe 105 and LED 110 using a base 410. The light pipe 105 may be positioned so that light 150 created by the LED 110 passes through the light pipe 105 to exit as shown. The LED 110 may be positioned within the base 410. The base 410 may also be connected to the light pipe 105. The pins 130 are coupled to and extend from the LED 110 inside the base 410 to outside the base 410. The pins 130 may allow for the integrated light pipe 400 to be mounted and electrically connected to a body. In various embodiments, the body the integrated light pipe 400 may be mounted and electrically connected to may be a circuit board.

In various embodiments, the base 410 may be made of a single element or a combination of elements. For example, in an embodiment the base 410 may be a single molded plastic piece. The LED 110 may be positioned within the base 410 by molding into it during manufacture. The plastic may be translucent to allow light from the LED 110 to reach and enter the light pipe 105. In other embodiments, the base 410 may have a cavity filled with an adhesive, in some cases the same as translucent adhesive 120. The LED 110, light pipe 105, and pins 130 may be positioned to be either partially or fully contained in the translucent adhesive 120. The pins 130 may extend out of the cavity and through the base 410 for mounting the integrated light pipe 400.

In various embodiments, the base 410 may be coupled with the light pipe 105 by use of mechanical means or adhesives. For example, if the base 410 was of a molded plastic type the light pipe 105 may be connected with either an adhesive, such as epoxy, or mechanical means such as screws or pins. Other embodiments may use a press fit type of connection to couple the base 410 and light pipe 105. It is contemplated that, a variety of coupling means may possibly be used and be within the scope of the invention.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments, reference was made to the accompanying drawings (where like numbers represent like elements), which form a part hereof, and in which is shown by way of illustration specific exemplary embodiments in which the embodiments may be practiced. These embodiments were described in sufficient detail to enable those skilled in the art to practice the embodiments, but other embodiments may be utilized and logical, mechanical, electrical, and other changes may be made without departing from the scope of the embodiments. In the previous description, numerous specific details were set forth to provide a thorough understanding of embodiments. But, embodiments may be practiced without these specific details. In other instances, well-known structures and techniques have not been shown in detail in order not to obscure embodiments.

What is claimed is:

1. An apparatus, comprising:
    a light pipe with an internal cavity positioned within a first end of the light pipe;
    a light emitting diode (LED) coupled to the light pipe within the internal cavity, wherein
        the LED at least partially fits within the light pipe and wherein light emitted from
        the LED is directed through the light pipe;
    a first and second conductive mount coupled to the LED and extending out of the cavity; and
        a resistor, located within the internal cavity, connected in series with the LED and integrated with the first conductive mount;
        wherein the light pipe, the LED, and the first and second conductive mount form
        an integrated light pipe, and wherein the first and second conductive mount is configured for mounting and electrically connecting the integrated light pipe to a body.

2. The apparatus of claim 1, wherein the first and second conductive mounts are pins.

3. The apparatus of claim 2 further comprising:
    the body, wherein the body is a circuit board having receptors to receive the first and second conductive mounts.

4. The apparatus of claim 1, wherein the first and second conductive mounts are surface mount technology mounts.

5. The apparatus of claim 4, further comprising:
    a shield, wherein the first and second conductive mounts pass through the shield.

6. The apparatus of claim 1, wherein the LED is coupled to the light pipe with a translucent bonding agent.

7. An apparatus, comprising:
    a light pipe with a first and second end; a light emitting diode (LED); a base with an internal cavity, the first end of the light pipe coupled to the base within the internal cavity, wherein the LED is positioned inside the base such that light from the LED is directed through the first end of the light pipe to the second end of the light pipe; a first and a second conductive mount extending from the LED out of the base; and a resistor located within the base element, connected in series with the LED and integrated with the first conductive mount; wherein the light pipe, the LED, the base, and the first and second conductive mount form an integrated light pipe, and wherein the first and second conductive mount is configured for mounting and electrically connecting the integrated light pipe to a body.

8. The apparatus of claim 7, wherein the first and second conductive mounts are pins.

9. The apparatus of claim 7 further comprising:
the body, wherein the body is a circuit board having receptors to receive the first and second conductive mounts.

10. The apparatus of claim 7, wherein the first and second conductive mounts are surface mount technology mounts.

11. The apparatus of claim 10 further comprising:
a shield, wherein the first and second conductive mounts pass through the shield.

12. A method of manufacturing an integrated light pipe, the method comprising: providing a light pipe with first and second ends, an internal cavity within the first end; coupling a light emitting diode (LED) to the light pipe within the internal cavity; wherein the LED at least partially fits within the light pipe, and such that light emitted from the LED is directed through the light pipe from the first end to the second end of the light pipe; and positioning the first and second conductive mounts to couple with the LED and extend out of the cavity, positioning a resistor within the internal cavity and connected in series with the LED and integrated with the first conductive mount, wherein the light pipe, the LED, and the first and second conductive mounts form the integrated light pipe, and wherein the first and second conductive mounts are configured for mounting and electrically connecting the integrated light pipe to a body.

13. The method of claim 12, wherein the first and second conductive mounts are pins.

14. The method of claim 12, further comprising:
mounting the first and second conductive mounts to the body, wherein the body is a circuit board having receptors to receive the conductive mounts.

15. The method of claim 12, wherein the first and second conductive mounts are surface mount technology mounts.

16. The method of claim 15, further comprising:
providing a shield element, positioned such that the first and second conductive mounts pass through the shield.

17. The method of claim 12, wherein the LED is coupled to the light pipe with a translucent bonding agent.

* * * * *